(12) United States Patent
Meldrim et al.

(10) Patent No.: US 7,830,016 B2
(45) Date of Patent: Nov. 9, 2010

(54) SEED LAYER FOR REDUCED RESISTANCE TUNGSTEN FILM

(75) Inventors: Mark Meldrim, Boise, ID (US); Allen Mcteer, Eagle, ID (US); Alain P. Blosse, Belmont, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 12/165,176

(22) Filed: Jun. 30, 2008

(65) Prior Publication Data

US 2009/0321943 A1    Dec. 31, 2009

(51) Int. Cl.
H01L 21/44    (2006.01)
(52) U.S. Cl. ........................ 257/770; 257/764
(58) Field of Classification Search .............. 257/770, 257/763, 764
See application file for complete search history.

(56) References Cited

U.S. PATENT DOCUMENTS

| | | | |
|---|---|---|---|
| 6,110,826 A * | 8/2000 | Lou et al. ............... 438/674 |
| 6,310,300 B1 | 10/2001 | Cooney |
| 6,734,097 B2 | 5/2004 | Iggulden |
| 7,666,785 B2 * | 2/2010 | Sung et al. ............... 438/643 |
| 2006/0063025 A1 * | 3/2006 | Huang et al. ............. 428/627 |
| 2008/0089111 A1 * | 4/2008 | Lee et al. ................ 365/148 |
| 2008/0237798 A1 * | 10/2008 | Lee et al. ................ 257/536 |
| 2008/0247214 A1 * | 10/2008 | Ufert ...................... 365/148 |
| 2008/0248327 A1 * | 10/2008 | Huang et al. ............. 428/651 |
| 2009/0142925 A1 * | 6/2009 | Ha et al. .................. 438/680 |

OTHER PUBLICATIONS

S. B. Herner, et al., "Fluorine Barrier Properties of Bias-Sputtered Tungsten Films", Journal of The Electrochemical Society, 147 (5) pp. 1936-1939 (2000).

* cited by examiner

*Primary Examiner*—Thao P. Le
(74) *Attorney, Agent, or Firm*—Cool Patent, P.C; Joseph P. Curtin

(57) ABSTRACT

Briefly, a memory device comprising a beta phase tungsten seed layer is disclosed.

14 Claims, 2 Drawing Sheets

SEED LAYER FOR REDUCED RESISTANCE TUNGSTEN FILM

BACKGROUND

Technical Field

This disclosure relates to semiconductor wafer processing; more particularly, the present disclosure relates to a method of chemical vapor deposition of tungsten over a seed layer of tungsten.

DETAILED DESCRIPTION

In the following detailed description, numerous specific details are set forth in order to provide a thorough understanding of claimed subject matter. However, it will be understood by those skilled in the art that claimed subject matter may be practiced without these specific details. In other instances, well-known methods, procedures, and components have not been described in detail so as not to obscure claimed subject matter.

Figure 1:
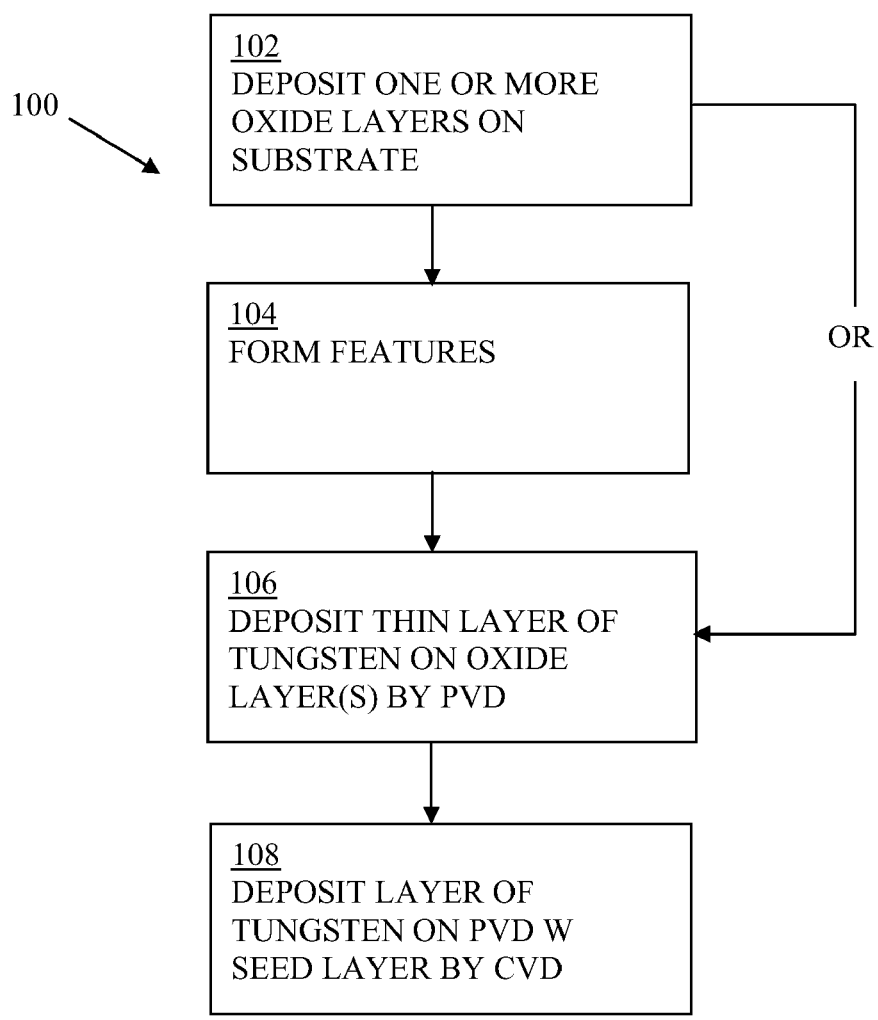
FIG. 1 is a block diagram illustrating a particular embodiment of a process for forming a lower resistance film stack comprising a thin tungsten seed layer.

FIG. 1 is a block diagram illustrating a process 100 for producing a reduced resistance film stack. Such a film stack may be used in assembly of a variety of devices, such as, for instance, a non-volatile memory device wordline, bitline and/or other interconnect features for memory, logic or high-frequency devices and claimed subject matter is not limited in this regard. Process 100 may begin at block 102 where one or more layers of oxide may be grown or deposited on a substrate. In a particular embodiment, such a substrate may comprise a variety of materials, such as, silicon, gallium arsenide, silicon carbide, silicon germanium, germanium and/or poly-silicon and claimed subject matter is not limited in this regard. Additionally, materials grown or deposited on such a substrate may comprise a high-K oxide (for example, zirconium oxide and/or hafnium oxide), silicon nitride, silicon carbide, silicon oxy-nitride, aluminum oxide and/or silicon dioxide and claimed subject matter is not limited in this regard.

According to a particular embodiment, process 100 may proceed to block 104 where features, such as trenches and/or contacts, may be formed on the oxide. However, in another particular embodiment, process 100 optionally may proceed from block 102 to block 106 where no features may be formed and the oxide may maintain a substantially planar shape and claimed subject matter is not limited in this regard.

In a particular embodiment, process 100 may proceed to block 106 where a thin film of substantially pure tungsten (W) may be deposited over the oxide via physical vapor deposition (PVD). In an alternative embodiment, one or more intervening layers may be formed between an oxide and PVD W layer. Such intervening layers may comprise a variety of materials such as tin nitride, tungsten nitride and/or tantalum nitride and claimed subject matter is not limited in this regard. In a particular embodiment, a thickness of a PVD W film may range between about 25 Å to about 250 Å. In a particular embodiment, a PVD W film may be less than about 150 Å and claimed subject matter is not limited in this regard.

In a particular embodiment, a layer of PVD W formed at block 106 may function as a seed layer for a subsequent deposition by chemical vapor deposition (CVD) of W film at block 108. As discussed more fully below, such a CVD W layer may be deposited by bulk CVD deposition or pulsed nucleation and claimed subject matter is not limited in this regard.

In a particular embodiment, PVD W deposition conditions may be controlled in such a way as to increase an amount of W deposited in a beta phase. According to a particular embodiment, a film of tungsten may comprise various phases including alpha- and beta-phase tungsten. According to a particular embodiment, an alpha-phase tungsten may be characterized a cubic crystalline structure comprising a space group of Im-3m and 2 atoms/units per cell. Beta-phase tungsten may be characterized by a cubic crystalline structure comprising a space group of Pm-3n having 8 atoms/units per cell. In a particular embodiment, the ratio of alpha-phase W to beta-phase W may be dependent on the deposition conditions and substrate. Controlling deposition conditions and thickness of a PVD W film may enable increasing an amount of deposited W in the beta phase without the use of a titanium and/or nitride substrate.

In a particular embodiment, PVD conditions to enable increased PVD W deposition in a beta phase may comprise: setting a target to substrate distance from about 10 mm to about 500 mm. In another particular embodiment, the distance between a target and substrate may be about 40 mm and 400 mm. According to a particular embodiment, chamber pressure during PVD W deposition may be in a range of between about 0.4 mTorr and 15 mTorr. In another particular embodiment, a chamber pressure range may be between about 0.6 mTorr and 3 mTorr. In a particular embodiment, an applied cathode power may range between about 0.5 kilowatts and 30 kilowatts. According to another particular embodiment, a cathode power range may be between about 1 kilowatt and 15 kilowatts. In a particular embodiment, an applied wafer bias power may range between about 0 watts and 1200 watts. In another particular embodiment, an applied wafer bias power range may be between about 200 watts and 800 watts. However, these are merely examples of PVD conditions that may promote increased W deposition in a beta phase and claimed subject matter is not so limited.

According to a particular embodiment, process 100 may proceed to block 108 where a layer of W may be deposited on a PVD W seed layer by chemical vapor deposition (CVD). In a particular embodiment, such chemical vapor deposition may comprise a variety of processes, such as, bulk deposition, diborane (B2H6) based nucleation and/or silane (SiH4) based nucleation and claimed subject matter is not limited in this regard.

In a particular embodiment, increasing a beta phase of a thin film PVD W seed layer may enable increasing the grain size of later deposited CVD W over conventional methods. For instance, in a particular embodiment, a CVD W layer may comprise various grain sizes wherein a grain diameter of a CVD W layer deposited over a PVD W seed layer may range from about 0.05 μm to 5 μm. In another particular embodiment, various grain sizes may range from about 0.3 μm to 3 μm in diameter. However, these are merely examples of various CVD W grain diameter ranges and claimed subject matter is not limited in this regard.

An increase in grain size of a CVD W layer may lower resistance of a CVD W layer. When combined with the lower resistance of the PVD W barrier, the entire film stack may have a lower resistance than conventional films. Additionally, where a PVD W seed layer is deposited in a trench feature, a CVD W layer deposited on such a PVD W seed layer in a trench feature may comprise a reduced resistance.

In a particular embodiment, tungsten oxide (WOx) may be formed on a thin PVD W by oxygen diffusion from air and/or from oxygen trapped in a dielectric film. Additionally, according to a particular embodiment, PVD W on sidewalls of a trench feature may combine with oxygen from exposure to air and/or out diffusion from a dielectric substrate (or other source) thus PVD W may convert to WOx. Such WOx formation may further lower the resistance of a tungsten film.

As noted above CVD W deposition may be by bulk deposition or pulsed nucleation. Provided below are examples of CVD W deposition processes. However, these are merely examples of CVD W deposition processes and claimed subject matter is not limited in this regard.

CVD W Deposition Processes Examples:

In a particular embodiment, conditions for bulk deposition of CVD W capable of enabling increased CVD W grain size may comprise setting a chamber pressure in a range of about between 0.1 Torr and 300 Torr. In another particular embodiment, chamber pressure may be set in a range of about between 30 Torr and 50 Torr. Temperatures during bulk deposition may range between 200° C. and 450° C. In another particular embodiment, a bulk deposition temperature range may be between about 375° C. and 425° C.

In a particular embodiment, conditions for a diborane ($B_2H_6$) nucleation cycle for a CVD W process capable of enabling increased CVD W grain size may comprise a diborane ($B_2H_6$) soak, tungsten fluoride ($WF_6$) dose followed by [$B_2H_6$/$WF_6$] pulses. Such a nucleation cycle may be repeated in a range of 1 to 20 times. In another particular embodiment, diborane nucleation cycles may range between 1 and 4.

In a particular embodiment, for diborane nucleation cycling a chamber pressure may be set in a range of between about 0.1 Torr and 300 Torr. In another particular embodiment, chamber pressure may be set in a range of about between 30 Torr and 50 Torr. Temperatures during bulk deposition may range between 200° C. and 450° C. In another particular embodiment, a diborane nucleation temperature range may be between about 250° C. and 350° C.

According to a particular embodiment, a diborane nucleation layer thickness of CVD W may range between 0 Å and 200 Å. In another particular embodiment, CVD W nucleation layer thickness may be less than about 25 Å.

In a particular embodiment, conditions for a silane ($SiH_4$) based nucleation cycle for a CVD W process capable of enabling increased CVD W grain size may comprise: a silane ($SiH_4$) soak, tungsten fluoride ($WF_6$) dose followed by [$SiH_4$/$WF_6$] pulses. Such a nucleation cycle may be repeated in a range of 1 to 20 times. In another particular embodiment, silane nucleation cycles may range between 3 and 5.

In a particular embodiment, for silane nucleation cycling a chamber pressure may be set in a range of between about 0.1 Torr and 300 Torr. In another particular embodiment, chamber pressure may be set in a range of between about 30 Torr and 50 Torr. According to a particular embodiment, temperatures during silane nucleation cycling may range between about 200° C. and 450° C. In another particular embodiment, silane nucleation temperature range may be between about 250° C. and 350° C. According to a particular embodiment, a nucleation layer thickness of CVD W may range between 0 Å and 200 Å. In a particular embodiment, CVD W nucleation layer thickness may be less than about 25 Å. However, this is merely an example of a method of CVD W deposition by silane nucleation and claimed subject matter is not limited in this regard.

Figure 2:
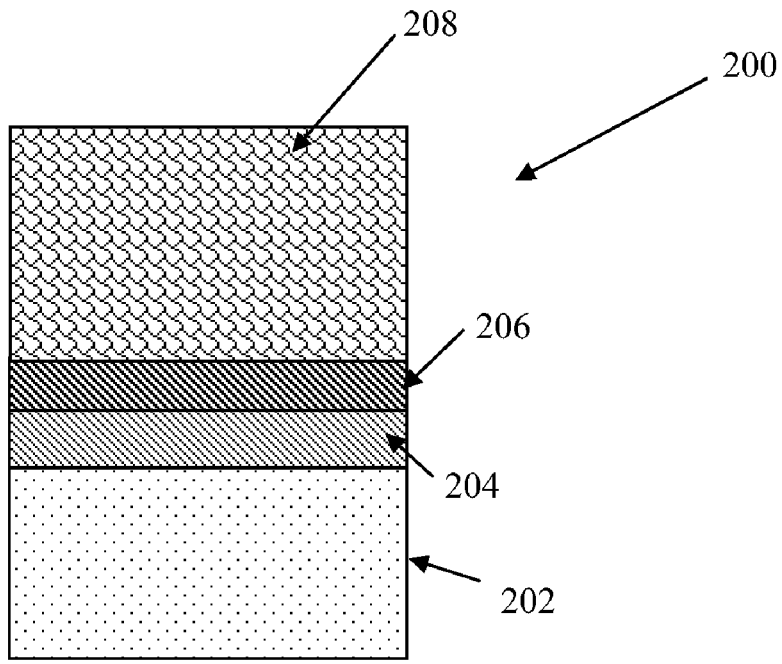
FIG. 2 is a sectional view of a particular embodiment of a lower resistance film stack comprising a thin tungsten seed layer.

FIG. 2 depicts a lower resistance CVD W film stack 200. Film stack 200 may comprise a substrate 202. Substrate 202 may comprise a variety of materials, such as, for instance silicon, gallium arsenide and/or polysilicon and claimed subject matter is not limited in this regard. In a particular embodiment, oxide layer 204 may be grown on substrate 202. Oxide layer 204 may comprise a variety of oxide materials such as, aluminum oxide and/or silicon dioxide and claimed subject matter is not limited in this regard.

According to a particular embodiment, PVD W seed layer 206 may be deposited on oxide layer 204 wherein conditions for deposition may be controlled to increase an amount of W in a beta phase. In a particular embodiment a controlled percentage of beta-W may be formed by controlling the deposition rate, film thickness, pressure, temperature and/or bias and claimed subject matter is not limited in this regard. PVD W layer 206 may have a thickness in the range of about 25 Å to about 200 Å. In a particular embodiment, film stack 200 may comprise CVD W layer 208 deposited over PVD W 206. In a particular embodiment, deposition of CVD W 208 over PVD W seed layer 206 may enable CVD W layer 206 formation comprising increased grain size over conventional methods. However, this is merely an example of a particular embodiment of a low resistance CVD W film stack and claimed subject matter is not limited in this regard.

Figure 3:
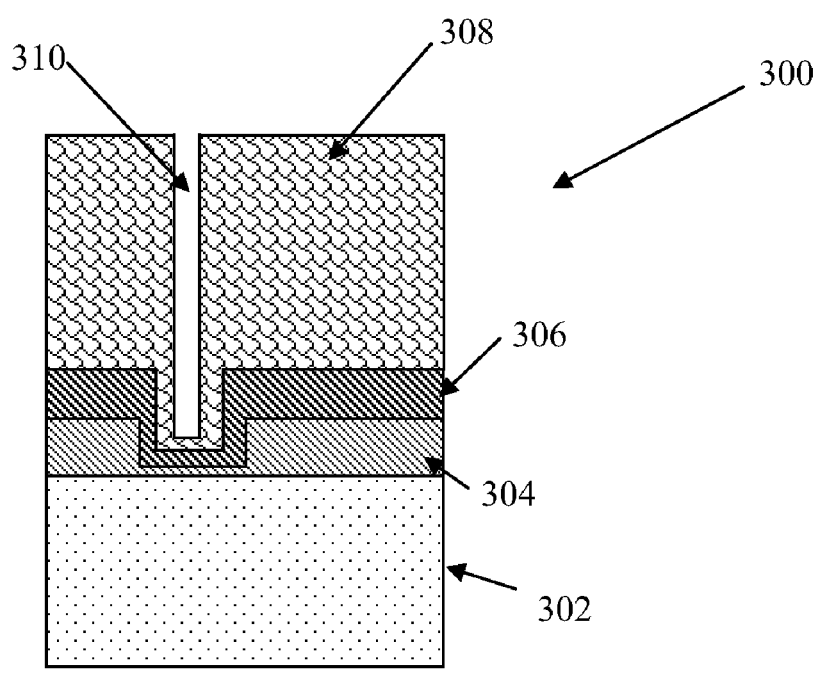
FIG. 3 is a sectional view of a particular embodiment of a lower resistance film stack comprising a thin tungsten seed layer.

FIG. 3 depicts a lower resistance CVD W film stack 300. Film stack 300 may comprise a substrate 302. In a particular embodiment, oxide layer 304 may be formed on substrate 302 and may comprise trench 310 formed thereon. Oxide layer 304 may comprise a variety of oxide materials as noted above. According to a particular embodiment, PVD W seed layer 306 may be deposited on oxide layer 304 wherein conditions for deposition may be controlled to increase an amount of PVD W in a beta phase. PVD W layer 306 may have a thickness in the range of about 25 Å to about 200 Å. In a particular embodiment, film stack 300 may comprise CVD W layer 308 deposited over PVD W 306. In a particular embodiment, deposition of CVD W 308 over PVD W seed layer 306 may enable CVD W layer 306 formation comprising increased grain size and decreased sidewall thickness over conventional methods. However, this is merely an example of a particular embodiment of a low-resistance CVD W film stack and claimed subject matter is not limited in this regard.

While certain features of claimed subject matter have been illustrated as described herein, many modifications, substitutions, changes and equivalents will now occur to those skilled in the art. It is, therefore, to be understood that the appended claims are intended to cover all such embodiments and changes as fall within the spirit of claimed subject matter.

What is claimed is:

1. An apparatus, comprising:
    a substrate;
    an oxide formed on the substrate;
    a seed layer of substantially pure tungsten (W) deposited directly on the oxide by physical vapor deposition (PVD), the PVD W comprising a greater percentage of W in a beta phase than W in an alpha phase; and
    a layer of tungsten deposited on the PVD W seed layer by chemical vapor deposition (CVD), the CVD W forming grains of various sizes.

2. The apparatus of claim 1, further comprising a trench feature disposed in the oxide, the PVD W seed layer and CVD W layer being disposed within the trench and the sidewalls of the trench being about 20 nanometers in thickness.

3. The apparatus of claim 1, wherein the grains of the CVD W layer are about 0.05 micrometers to about 5 micrometers in diameter.

4. The apparatus of claim 1, wherein the PVD W seed layer combines with oxygen to form a tungsten oxide (WOx) layer.

5. The apparatus of claim 1, wherein the PVD W seed layer comprises a thickness in a range of about 25 Å and about 250 Å.

6. The apparatus of claim 1, wherein the PVD W seed layer comprises a thickness in a range of about 25 Å and about 150 Å.

7. The apparatus of claim 1, wherein the CVD W layer comprises a thickness in a range of about 0 Å and 2000 Å.

8. The apparatus of claim 1, wherein the grains of the CVD W layer are about 0.3 micrometers to about 3 micrometers in diameter.

9. The apparatus of claim 1, further comprising a low-resistance film stack of a non-volatile memory device.

10. The apparatus of claim 2, wherein the grains of the CVD W layer are about 0.05 micrometers to about 5 micrometers in diameter.

11. The apparatus of claim 10, wherein the PVD W seed layer combines with oxygen to form a tungsten oxide (WOx) layer.

12. The apparatus of claim 11, wherein the PVD W seed layer comprises a thickness in a range of about 25 Å and about 250 Å.

13. The apparatus of claim 12, wherein the CVD W layer comprises a thickness in a range of about 0 Å and 200 Å.

14. The apparatus of claim 13, further comprising a low-resistance film stack of a non-volatile memory device.

* * * * *